US011961577B2

(12) United States Patent
Abhishek et al.

(10) Patent No.: US 11,961,577 B2
(45) Date of Patent: Apr. 16, 2024

(54) TESTING OF ON-CHIP ANALOG-MIXED SIGNAL CIRCUITS USING ON-CHIP MEMORY

(71) Applicant: NXP USA, Inc., Austin, TX (US)

(72) Inventors: Kumar Abhishek, Bee Cave, TX (US); Xiankun Jin, Austin, TX (US); Mark Lehmann, Munich (DE)

(73) Assignee: NXP USA, Inc., Austin, TX (US)

( * ) Notice: Subject to any disclaimer, the term of this patent is extended or adjusted under 35 U.S.C. 154(b) by 134 days.

(21) Appl. No.: 17/810,671

(22) Filed: Jul. 5, 2022

(65) Prior Publication Data

US 2024/0013848 A1 Jan. 11, 2024

(51) Int. Cl.
*G11C 29/46* (2006.01)
*G11C 7/16* (2006.01)
*G11C 29/18* (2006.01)
*H03M 1/46* (2006.01)

(52) U.S. Cl.
CPC .............. *G11C 29/46* (2013.01); *G11C 7/16* (2013.01); *G11C 29/18* (2013.01); *H03M 1/462* (2013.01)

(58) Field of Classification Search
CPC ........... G11C 29/46; G11C 29/18; G11C 7/16; H03M 3/388; H03M 3/464; H03M 1/123; H03M 1/38; H03M 1/66; H03M 1/1038; H03M 1/108; H03M 1/109; H03M 1/462
See application file for complete search history.

(56) References Cited

U.S. PATENT DOCUMENTS

| 6,925,408 | B2 | 8/2005 | Premy et al. |
| 8,310,385 | B2 | 11/2012 | Dasnurkar |
| 10,788,532 | B2 | 9/2020 | Deutsch et al. |
| 2005/0197795 | A1* | 9/2005 | Aas ............... G01R 35/005 702/107 |

(Continued)

FOREIGN PATENT DOCUMENTS

CN 101067562 A 11/2007

OTHER PUBLICATIONS

Chen, et al.: "USER-SMILE: Ultrafast Stimulus Error Removal and Segmented Model Identification of Linearity Errors for ADC Built-in Self-Test," IEEE Transactions on Circuits and Systems I: Regular Papers ( vol. 65, Issue: 7, Jul. 2018), DOI: 10.1109/TCSI.2017. 2775632, pp. 2059-2069.

(Continued)

*Primary Examiner* — Sultana Begum (57) ABSTRACT

Analog-to-digital converters (ADCs) of an integrated circuit includes a first set of ADCs and second set of ADCs in which the ADCs of the first set are of a different type than the ADCs of the second set. On-chip testing of the ADCs includes calibrating an N-bit differential digital-to-analog converter (DAC) and storing a pair of calibration codes for each of $2^N$ possible DAC input codes for the DAC in an on-chip memory. The first set of ADCs is tested using the pairs of calibration codes stored in the on-chip memory and a full N-bit resolution of the DAC. Subsequently, the second set of ADCs is tested using pairs of calibration codes corresponding to a reduced M-bit resolution of the DAC, in which M is less than N. During the testing of the second set of ADCs, a portion of the calibration codes stored in the on-chip memory is overwritten.

20 Claims, 4 Drawing Sheets

(56) References Cited

U.S. PATENT DOCUMENTS

2019/0178938 A1   6/2019 Jin et al.

OTHER PUBLICATIONS

Gonciari, et al.: "Integrated test data decompression and core wrapper design for low-cost system-on-a-chip testing," IEEE, Proceedings. International Test Conference, Oct. 10-10, 2002, DOI: 10.1109/TEST.2002.1041746, Baltimore, MD, USA, pp. 64-73.

Pilato, et al.: "System-level memory optimization for high-level synthesis of component-based SoCs," IEEE, 2014 International Conference on Hardware/Software Codesign and System Synthesis (CODES+ISSS), Oct. 12-17, 2014, DOI: 10.1145/2593069.2500071, Uttar Pradesh, India, pp. 1-10.

U.S. Appl. No. 17/302,729, Jin, et al.: "Analog-To-Digital Converter (ADC) Testing", filed May 11, 2021.

Zhuang, et al.: "High-Purity Sine Wave Generation Using Nonlinear DAC With Predistortion Based on Low-Cost Accurate DAC-ADC Co-Testing," IEEE Transactions on Instrumentation and Measurement ( vol. 67, Issue: 2, Feb. 2018), Nov. 16, 2017, DOI: 10.1109/TIM.2017.2769238, pp. 279-287.

* cited by examiner

FIG. 1

| RAM ADDRESS 0 - 8191 (DACCODE[13:1] = 0 - h1FFF) | (DACCODE[0] = 0) BIT 31:24 | (DACCODE[0] = 1) BIT 23:16 | (DACCODE[0] = 1) BIT 15:8 | (DACCODE[0] = 0) BIT 7:0 |
|---|---|---|---|---|
| Address0 (DACCODE[13:1] = h0); EVEN | pcode16383 | ncode1 | pcode16382 | ncode0 |
| Address1 (DACCODE[13:1] = h1); ODD | pcode16381 | ncode3 | pcode16380 | ncode2 |
| Address2 (DACCODE[13:1] = h2); EVEN | pcode16379 | ncode5 | pcode16378 | ncode4 |
| ••• | | | | |
| Address8191 (DACCODE[13:1] = h1FFF); ODD | pcode1 | ncode16383 | pcode0 | ncode16382 |

TESTING OF ON-CHIP ANALOG-MIXED SIGNAL CIRCUITS USING ON-CHIP MEMORY

BACKGROUND

Field

This disclosure relates generally to testing, and more specifically, to testing of on-chip analog circuits using on-chip memory.

Related Art

Production testing of different analog-mixed signal circuits on a chip are time consuming. One way to speed up the production tests is to perform the tests on-chip, which reduces the number of external devices and the interaction with them. For those on-chip tests, the reuse of available on-chip features, such as available on-chip memory, is beneficial. However, typically on-chip memory is limited. Therefore a need exists for on-chip testing of analog-mixed signal circuits, such as analog-to-digital converters (ADCs), in which the testing is capable of utilizing an on-chip size-constrained memory.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Testing of analog-mixed signal circuits is often desired during production, and may also be desired during use in the field (i.e. post-production). In one aspect, an integrated circuit (IC) having multiple different types of ADCs to be tested, referred to as ADCs under test, includes BIST circuitry capable of performing on-chip testing of these ADCs, while using a size-constrained on-chip memory, such as a random access memory (RAM). In one embodiment, the ADCs under test include at least one sigma delta ADC (SDADC) and at least one successive approximation register ADC (SARADC). The on-chip tests of the static and dynamic parameters of a SARADCs and an SDADC require a calibrated digital-to-analog converter (DAC) in which calibration data for this DAC must be stored in memory and at least partially available for testing of both types of ADCs. Additionally, the on-chip test for a SARADC requires use of the memory for storing intermediate test data. Therefore, for on-chip testing of both types of ADCs, calibration data as well as any data generated during the on-chip tests, needs to be stored in the same size-constrained on-chip memory.

In one embodiment, the on-chip memory available for use by the on-chip tests is a 32 Kilobyte (32 KB) RAM, thus the size-constrained amount of memory available is 32 KB. In this embodiment, the calibration data (i.e. calibration codes) for the DAC required in the testing of the SARADCs and SDADCs also requires 32 KB, which is the full available on-chip memory. Therefore, in one embodiment, the data from the on-chip tests are stored in an interleaved manner with the calibration data, in which selected calibration data is overwritten. The sequence of the ADC tests as well as the data arrangement in the on-chip memory is designed so as to make it possible to perform the required on-chip testing with the constrained memory.

For example, to perform the testing of both SARADCs and SDADCs on-chip, the SDADCs can be tested first using 14-bit resolution for the calibrated DAC, while the SARADCs can be tested afterwards, using just a 12-bit resolution for the calibrated DAC. In this manner, by using a higher resolution for the calibrated DAC in testing a first set of ADCs as compared to the resolution for the calibrated DAC in subsequently testing a second set of a different type of ADCs, the required storage for the calibration data is reduced. This allows for a portion of the on-chip memory to be overwritten when testing the second set of ADCs. Therefore, in one embodiment, BIST circuitry includes a memory engine which determines which memory addresses of the on-chip memory store calibration data for a calibrated DAC, which memory addresses are accessed for reading the calibration data in order to test the ADCs with the calibrated DAC, and at which addresses the test data and test results can be stored interleaved with the calibration data. The memory engine thereby ensures mutually exclusive operation on data in the memory both in time and in addressing.

Figure 1:
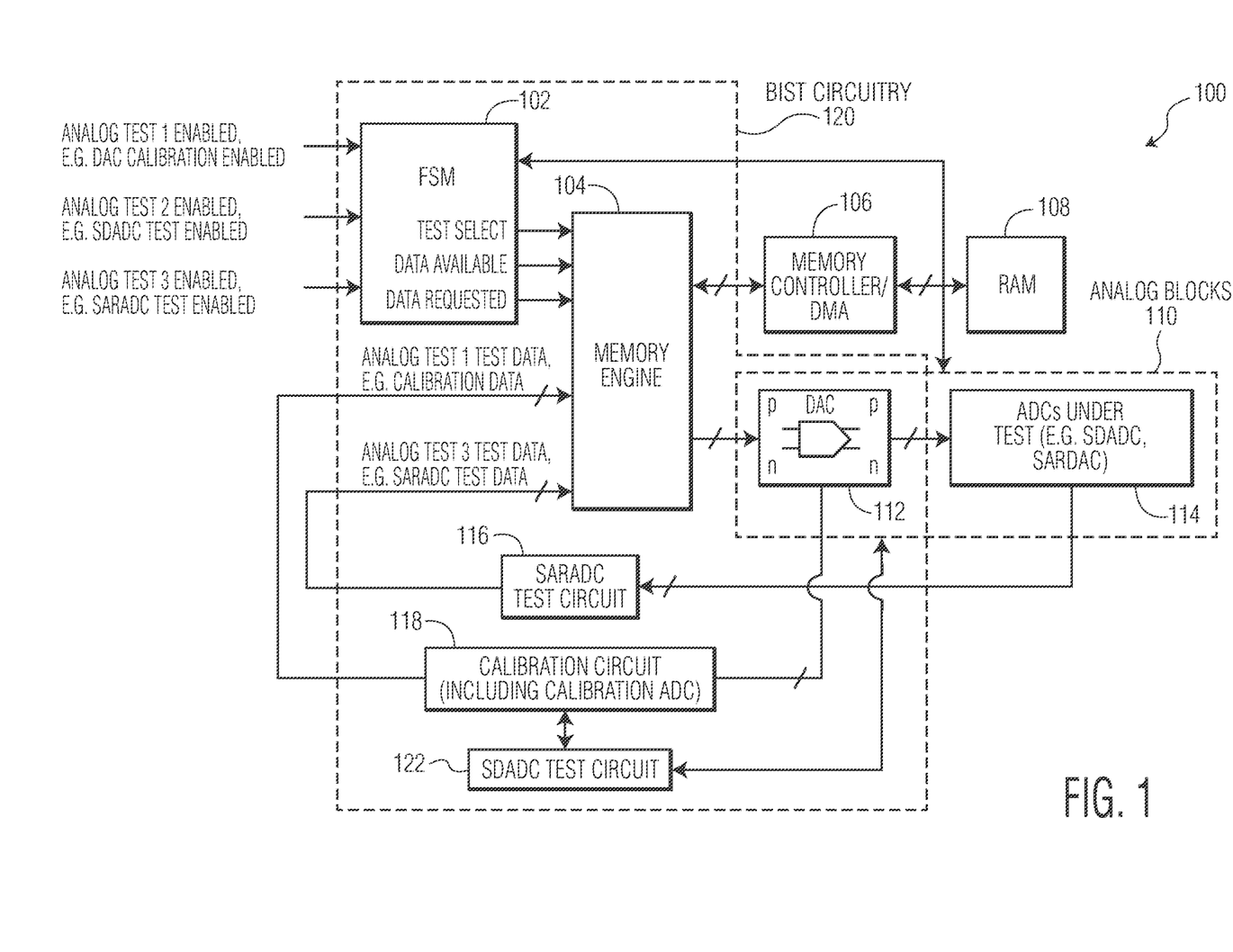
FIG. 1 illustrates, in block diagram form, an integrated circuit having built-in self-test (BIST) circuitry, various analog-mixed signal blocks which include analog-to-digital converters (ADCs) which are tested by the BIST circuitry, and an on-chip memory, in accordance with one embodiment of the present invention.

FIG. 1 illustrates an IC 100 (which may be implemented with a single IC and may also be referred to as a system on a chip (SoC)) including a control circuit 102 (which may be referred to as control circuitry or a testing control circuit and can be implemented using a finite state machine (FSM)), a memory engine 104, a memory controller 106 (which may be a direct memory access (DMA) controller), an on-chip memory 108, analog blocks 110, a SARADC test circuit 116 (which may also be referred to as SARADC test circuitry), a calibration circuit 118 (which may also be referred to as calibration circuitry), and SDADC test circuit 122 (which may also be referred to as SDADC test circuitry). In one embodiment, on-chip memory 108 is implemented as a RAM, and therefore can be referred to as RAM 108 herein. Also, in the illustrated embodiment, it is assumed that RAM 108 is a 32 KB RAM. However, in alternate embodiments, depending on the IC and the application of the IC, different types of on-chip memories may be used with different size-constrained amounts of available memory. Thus on-chip memory 108 is not limited to a 32 KB RAM.

Analog blocks 110 include a DAC 112 (which may also be referred to as a calibrated DAC or a testing DAC), and ADCs under test 114. In the illustrated embodiment, DAC 112 is a differential DAC having n and p inputs to receive a differential input signal, as well as n and p outputs to provide a differential output signal. ADCs under test 114 can include, for example, one or more SDADCs and one or more SARADCs. Analog blocks 110 can also include any other analog-mixed signal circuits, as needed. Note that any circuitry within IC 100 used in performing the on-chip testing of ADCs under test 114, such as control circuit 102, memory engine 104, SARADC test circuit 116, calibration circuit 118, SDADC test circuit 122, and calibrated DAC 112, can be referred to as built-in self-test (BIST) circuitry 120, specifically BIST circuitry for testing ADC performance. In alternate embodiments, BIST circuitry 120, as well as IC 100, may include other circuits and components, as needed, but which are not shown in the illustrated embodiment of FIG. 1, as they may not pertain to the aspects of on-chip testing of ADCs discussed herein.

Control circuit 102 includes an FSM and may also include one or more register(s), and is coupled to receive analog test enable signals (including, for example, a DAC calibration enable signal, an SDADC test enable signal, and a SARADC test enable signal), coupled to provide control signals to memory engine 104 (including a test select signal, a data available signal, and a data requested signal), and coupled to communicate signals with analog blocks 110 (including, for example, handshake signals generated by the FSM). The analog test enable signals can be received for example, from a master within IC 100 enabling the testing or an external port. As will be described herein, the FSM controls the execution sequence of the calibration and the testing, thus allowing for automatic control of BIST circuitry 120. Although not illustrated herein, the FSM can output additional signals, as needed, to control the ADC testing. For example, the FSM can output a calibration/test indicator and a static/dynamic indicator or other control signals, as needed, to calibration circuit 118, SARADC test circuit 116, SDADC test circuit 122, or to any of the analog blocks 110, during calibration and during testing. Register(s) within control circuit 102 and the FSM may also provide any necessary reset values or control input, as needed. For example, programmable constant values can be stored in registers which is provided to test circuits which perform the testing on the ADCs (such as, SARADC test circuit 116 and SDADC test circuit 122).

In one embodiment, SDADC test circuit 122 and SARADC test circuit 116 include digital circuitry which provides inputs to DAC 112, as needed, for calibration and testing. SDADC test circuit 122 applies calibration data to the inputs of DAC 112, as well as performs both dynamic and static testing of the SDADCs under test, and therefore includes circuitry, such as a counter, for generating ramp code values and a Coordinate Rotation Digital Computer (CORDIC) for generating sine wave codes. For example, as known in the art, performing static testing may include generating a ramp (such as with the counter) to provide as an input to the SDADC under test, and performing dynamic testing of the SDADC may include generating a coherent staircase sine wave on-the-fly within the IC (such as with the CORDIC) to provide as an input to the SDADC under test. (In an alternate embodiment, static testing of the SDADC is not performed.) As will be described below, calibration circuit 118 includes a counter used to obtain the calibration codes, and, in one embodiment, this same counter can be shared and used by SDADC test circuit 122 to generate the ramp code values for the static testing (if performed). SARADC test circuit 116 also provides ramp code values for testing a SARADC under test, and therefore, the same counter can be used to generate the ramp code values for use by SARADC test circuit 116 as well. Note that SDADC test circuit 122, calibration circuit 118, and SARADC test circuit 116 can all be implemented as known in the art.

In operation, calibration circuit 118 generates calibration data for DAC 112. In response to DAC calibration being enabled, control circuit 102 controls the determination of calibration codes by calibration circuit 118 for each possible input code to DAC 112, and controls the storage of these calibration codes into RAM 108, in which memory engine 104 is used to ensure that the calibration codes are stored in a desired arrangement within RAM 108. Each calibration code (also referred to as a correction code) represents a correction for an input code (DACCODE) to DAC 112. In the illustrated embodiment, DAC 112 is a 14-bit resolution DAC, therefore, each input code is a 14-bit value (DACCODE[13:0]). The calibration codes are stored in RAM 108 such that each possible input code (of the $2^{14}$ possible input codes) has a respective calibration code in RAM 108 for correcting the output of DAC 112. In the case in which DAC 112 is a differential output DAC, as illustrated in FIG. 1, there are two outputs that need to be calibrated with each input code. Therefore, each DAC output, output_p and output_n, needs a corresponding calibration code (pcode and ncode, respectively) for each input code, in which the pcode value is used on the p input of the DAC and the ncode value is used on the n input of the DAC. In the current embodiment, each calibration code is 8-bits wide, resulting in a total calibration data size of "$2 \times 2^{14} \times 8$ bits=32 KB," in which RAM 108 is also 32 KB. Therefore, storage of the full set of calibration codes requires the entire on-chip memory.

In one embodiment, calibration circuit 118 determines calibration codes (pcodes and ncodes) using DAC 112, a calibration ADC, a counter, and calibration logic, in which control circuit 102 controls the execution sequence of the calibration. For calibration, the counter of calibration circuit 118 is triggered to generate digital codes corresponding to a ramp, and these digital codes are provided as inputs to DAC 112. DAC 112 converts the digital codes into an analog ramp. The output of DAC 112 is then converted by the calibration ADC to a digital signal which is provided to the calibration logic. The calibration logic interprets the results as the nonlinearity of DAC 112 and provides the resulting calibration code for each digital DAC input code to DAC 112 for storage into RAM 108. Any known calibration algorithm can be implemented by calibration logic to determine the resulting calibration codes. For example, the calibration logic may implement the uSMILE-ROME algorithm as described in "High-Purity Sine Wave Generation Using Nonlinear DAC With Predistortion Based on Low-Cost Accurate DAC-ADC Co-Testing", published in *IEEE Transactions on Instrumentation and Measurement*, vol. 67, no. 2, pp. 279-287. Note that the calibration ADC may be located anywhere on-chip, and can be any one of the ADCs in analog blocks 110.

In one embodiment, each value of the ramp input to DAC 112 (provided by the counter in calibration circuit 118) is also used to provide the address location at which the corresponding calibration code is stored. For example, assuming DAC 112 is a 14-bit DAC, a 14-bit counter can be used in calibration circuit 118 such that each 14-bit counter value (e.g. all zeros up to all ones) indicates an address location of RAM 108 at which the calculated calibration code corresponding to that DAC code is stored. That is, RAM 108 can be implemented as a type of content addressable memory (CAM). Memory engine 104 receives control information from the FSM of control circuit 102 and communicates with memory controller 106 so as to arrange the calibration data (including the pcodes and ncodes for each of the $2^{14}$ input codes) into RAM 108. Arrangement of the calibration data and determination of the appropriate address locations will be described in reference to FIG. 2 below.

For the ADC testing, SDADC test circuit 122 provides ramp code values (generated by the counter) or sine wave codes (generated by the CORDIC) to DAC 112 which creates the analog ramp for ADC static testing or the analog staircase sine wave for ADC dynamic testing, respectively. (In alternate embodiments, SDADC test circuit 122 may only perform dynamic testing and not static testing, in which case SDADC test circuit 122 provides the sine wave codes to DAC 112 but not ramp code values.) SARADC test circuit 116 provides ramp code values (generated by the counter) to DAC 112 which creates the analog ramp for SARADC testing. Control circuit 102 provides the appropriate control signals to the SDADC and SARADC test circuits to execute the testing and to memory engine 104 to obtain the proper information from RAM 108 or to store information into RAM 108, as required during the testing. For each input value (i.e. DACCODE) to be provided by SDADC test circuit 122 or SARADC test circuit 116 to DAC 112, appropriate calibration codes (a corresponding pcode and ncode) are obtained from RAM 108 and applied to the DACCODE. For example, depending on the implementation and how the calibration codes are written to RAM 108 (i.e. as positive or negative values), the calibration codes can be added to or subtracted from the DACCODE. The DAC-CODE as corrected by the corresponding pcode and the DACCODE as corrected by the corresponding ncode are then provided to the differential inputs of DAC 112.

The corrected DACCODE is converted by DAC 112 and provided to one of the ADCs under test 114 as test input data. The outputs of the ADC being tested can then be provided to a performance calculation circuit (which may be located, for example, within ADC test circuits 116 or 122 or elsewhere within IC 100). Any known performance calculation can be performed to determine if the tested ADC is performing satisfactorily. Note that performance calculation circuit can be referred to as a performance monitor and implement any type of performance monitoring.

If the ADC being tested with DAC 112 is an SARADC, as opposed to an SDADC, intermediate test data is generated by SARADC test circuit 116. SARADC test circuit 116 can implement any known SARADC test algorithm. For example, one embodiment may implement the USER-SMILE algorithm as described in "USER-SMILE: Ultrafast Stimulus Error Removal and Segmented Model Identification of Linearity Errors for ADC Built-in Self-Test", published in *IEEE Transactions on Circuits and Systems 1: Regular Papers*, vol. 65, Issue: 7, July 2018, pp. 2059-2069. Typically, the SARADC test algorithms require the use of intermediate data, in which this test data is also stored into RAM 108. However, in order to do so, a portion of the calibration code needs to be overwritten because the RAM is constrained in size and is the same size as the total calibration data. Due to the arrangement of calibration data in RAM 108, though, certain address locations of RAM 108 can be safely accessed and overwritten during such SARADC testing. The proper locations can be accessed via memory engine 104 during the SARADC testing to make sure needed calibration data is not overwritten. The FSM of control circuit 102 also controls calibration and testing to ensure that accesses to RAM 108 are mutually exclusive in both time and addressing, as will be seen in the example of FIG. 3.

Figure 2:
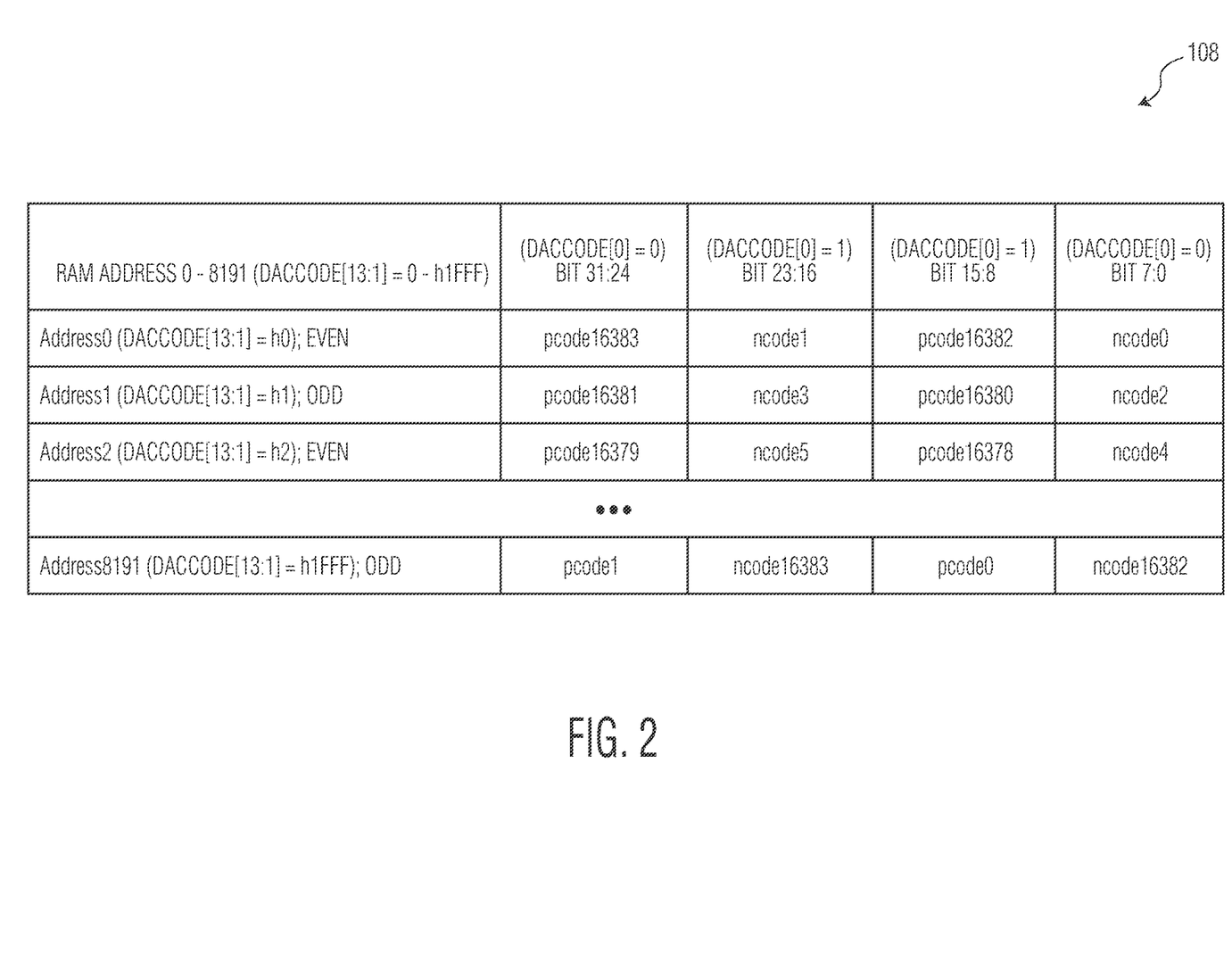
FIG. 2 illustrates, in diagrammatic form, data arranged in the on-chip memory of FIG. 1, in accordance with one embodiment of the present invention.

FIG. 2 illustrates an example of RAM 108 in which memory engine 104 arranges the storage of the calibration data. RAM 108 has a 32-bit wide data line, in which the input code to DAC 112 can be used as the byte address of RAM 108, at which the corresponding correction code is stored. For example, when the input code to DAC 112 is 0, the data stored at address 0 is the correction code for the DAC input code of 0. With each read of RAM 108, though, since each data line is 32-bits wide, 4-bytes of data are read. The calibration codes are arranged in RAM 108 such that the corrections codes for the p and n inputs (pcode and ncode) for a DAC input code can be read with a single memory access. For example, in order to generate the maximal differential output voltage, the p input of DAC 112 needs to be driven by the input code of 0x3FFF (in which the prefix "0x" indicates the value that follows is in hexadecimal format) and the n input needs to be driven by the input code 0x0. In this example, the pcode corresponding to the input code 0x3FFF needs to be added to the p input while the ncode corresponding to the input code 0x0 needs to be added to the n input. When the input code is 0x0, the ncode corresponding to 0x0 is needed and the pcode corresponding to 0x3FFF is needed, and should be accessible with a single memory access to RAM 108. Therefore, for each input code to DAC 112, a pair of correction codes is needed (the ncode corresponding to the input code, and the pcode corresponding to 0x3FFF minus the input code. (Note that 0x3FFF converted to decimal is 16383.)

The table of FIG. 2 represents an arrangement of RAM 108 which stores ncode value/pcode value pairs for each of the possible $2^{14}$ input codes for DAC 112 (i.e. for each value of DACCODE[13:0]). Each row of RAM 108 includes 32 bits in which bits [23:16] (byte 2) and bits [7:0] (byte 0) each store an ncode value, and bits [15:8] (byte 1) and bits [31:24] (byte 3) each store a pcode value. In each row, the outer pair of ncode/pcode values corresponds to one input code, identified by the decimal number following the ncode, and the inner pair of ncode/pcode values corresponds to the next sequential input code, also identified by the decimal number following the ncode. Therefore, the first row of RAM 108 stores 32-bits (4 bytes) including two pairs of 8-bit correction codes: ncode0/pcode16383 and ncode1/pcode16382. Therefore, with an input code of 0x0, the stored value of ncode0 is added to the input code for the n-input, and the stored value of pcode16383 is added to the input code for the p-input. Similarly, with an input code of 0x1, the stored value of ncode1 is added to the input code for the n-input, and the stored value of pcode16382 is added to the input code for the p-input.

Continuing with the next row of RAM 108, the second row includes the following two pairs of 8-bit correction codes: ncode2/pcode16381 and ncode3/pcode16380. Therefore, with an input code of 0x2, the stored value of ncode2 is added to the input code for the n-input, and the stored value of pcode16381 is added to the input code for the p-input. Similarly, with an input code of 0x3, the stored value of ncode3 is added to the input code for the n-input, and the stored value of pcode16380 is added to the input code for the p-input. Therefore, RAM 108 stores an ncode value for each of DAC input 0-16383 (which covers all of the $2^{14}$ values of a 14-bit DAC input). In the case of differential inputs for DAC 112, RAM 108 also stores a paired pcode value with each ncode value, as illustrated in the example of FIG. 2. In this manner, for a differential DAC, RAM 108 stores correction values (ncode and pcode values) for 0 to 16383 data points, resulting in a total of two times $2^{14}$ (i.e. two times 16384) correction values. Also, note that the calibration values can be stored in 2s complement format, thus allowing for positive or negative values for the calibration values.

In the illustrated example, with each input code for DAC 112, represented as DACCODE[13:0], only the upper 13 significant bits, DACCODE[13:1], is used to access the appropriate memory line of RAM 108. For example, for the first row, regardless of whether DACCODE[13:0] is 0x0 or 0x1, the first row of RAM 108 is read (which corresponds to DACCODE[13:1]=0x0) to obtain the corresponding ncode/pcode value pair. For the second row, regardless of whether DACCODE[13:0] is 0x2 or 0x3, the second row is read (which corresponds to DACCODE[13:1]=0x1) to obtain the corresponding ncode/pcode value pair. For the third row, regardless of whether DACCODE[13:0] is 0x4 or 0x5, the third row is read (which corresponds to DACCODE[13:1]=0x2) to obtain the corresponding ncode/pcode value pair. In the last row, regardless of whether DACCODE[13:0] is 0x3FFE or 0x3FFF, the last row is read (which corresponds to DACCODE[13:1]=0x1FFF) to obtain the corresponding ncode/pcode value pair.

In the arrangement illustrated in FIG. 2, the least significant bit (LSB) of the input code (DACCODE[0]) is used to identify either the outer pair of correction code values or the inner pair of correction code values. Since each read access returns 4 bytes of data from RAM 108, which is greater than the needed 2 bytes of correction code data, the value of DACCODE[0] is used to select the required 2 bytes from the received 4 bytes of data. For example, upon reading RAM 108 using DACCODE[13:1] as the read address, DACCODE[0] can be used by the requesting circuitry (e.g. SDADC test circuit 122 or SARADC test circuit 116) to select the needed ncode/pcode calibration values for the corresponding 14-bit input code (DACCODE[13:0]). Alternatively, memory engine 104 can use DACCODE[0] to provide the correct ncode/pcode pair from the 4 bytes of read data to the requesting circuitry.

In the case of performing on-chip testing of an ADC which requires the full 14-bit resolution of DAC 112, such as for any SDADC, all of RAM 108 is required for storing the calibration data for each of the possible $2^{14}$ input codes for DAC 112. However, in the case of performing on-chip testing of an ADC which does not require the full 14-bit resolution, such as for any SARADC in which only 12-bit resolution is needed, any unneeded calibration data can be overwritten with intermediate test data. In the illustrated example of FIG. 2, in the case of 12-bit input codes for DAC 112, only the address lines with even values of DACCODE[13:1] (labeled with EVEN in FIG. 2) are needed for storing the required ncode/pcode value pairs. That is, any of the address lines with odd values of DACCODE[13:1] (labeled with ODD in FIG. 2) can be used as needed for the testing, such as for storing intermediate test values.

For example, in the case of DAC 112 only needing 12-bit resolution, only every fourth ncode/pcode value pair is needed to provide calibration data for each of the possible $2^{12}$ 12-bit input codes: ncode0/pcode 16383 (corresponding to DACCODE[13:1]=0x0), ncode4/pcode16389 (corresponding to DACCODE[13:1]=0x2), . . . , ncode16380/pcode3 (corresponding to DACCODE[13:1]=0x1 FFE). These calibration codes are all located in address lines addressed by DACCODE[13:1] when DACCODE[13:1] is an even value (i.e. DACCODE[13:2]=12-bit input code and DACCODE[1]=0). Further, these calibration codes correspond to DACCODE[0], i.e. the LSB, being 0. That is, these calibration codes are always stored in predetermined byte locations (outer byte locations byte 0/byte 3) of DACCODE[13:1]. Therefore, any correction codes stored in the address lines addressed by DACCODE[13:1] in which DACCODE[13:1] has an odd value (i.e. DACCODE[1]=1) are not needed by DAC 112 using only 12-bit resolution and thus can be overwritten, as needed, while performing the SARADC test. By providing the SARADC test data to memory engine 104, memory engine 104 can store the test data in these available address lines of RAM 108 (interleaved with needed calibration data), overwriting any unused calibration codes.

Memory engine 104, in general, provides data and corresponding write addresses to memory controller 106 for writing the data into RAM 108, and provides read address to memory controller 106 for reading data from RAM 108. Memory engine 104, based on control signals from the FSM of control circuit 102, knows if calibration or testing is being performed, and what kind of testing. With this information from the FSM, memory engine 104 knows when new data needs to be written to RAM 108 or when data must be retrieved from RAM 108. In the case of calibration (in which DAC calibration is enabled as indicated by the test select signal from the FSM), memory engine 104 receives calibration data from calibration circuit 118 and provides the calibration data along with the appropriate write address to memory controller 106 for storage into RAM 108. Memory engine 104 provides the calibration and write address so as to store the calibration data is in accordance with the desired arrangement, such as the arrangement illustrated in FIG. 2. Similarly, during ADC testing (when SDADC or SARADC testing is enabled as indicated by the test select signal from the FSM), memory engine 104 provides the appropriate read addresses to memory controller 106 so as to obtain the appropriate calibration data or test data. For example, in the case of SARADC testing, memory engine 104 writes and reads intermediate test data to and from RAM 108 using the appropriate addresses of RAM 108 which can be overwritten, as was described above. For example, in the illustrated embodiment of FIG. 2, memory engine 104 can utilize those address lines with odd values of DACCODE[13:1] to read and write the intermediate test data for the SARADC testing. The data available signal and data requested signal indicates to memory engine 104 when data is available for storage into RAM 108 or when data is requested from RAM 108. They are also communicated with the ADC under test in analog blocks 110 for use as handshake signals.

In one embodiment, memory engine 104 is implemented completely in hardware. For example, memory engine 104 can be implemented with combinational logic which provides the appropriate write addresses in RAM 108 at which to write calibration or test data. Alternatively, other circuits may be used to provide the functionality of memory engine 104. The FSM of control circuit 102 can also be implemented with any type of circuitry, as known in the art, to implemented the functionality of state machines.

Figure 3:
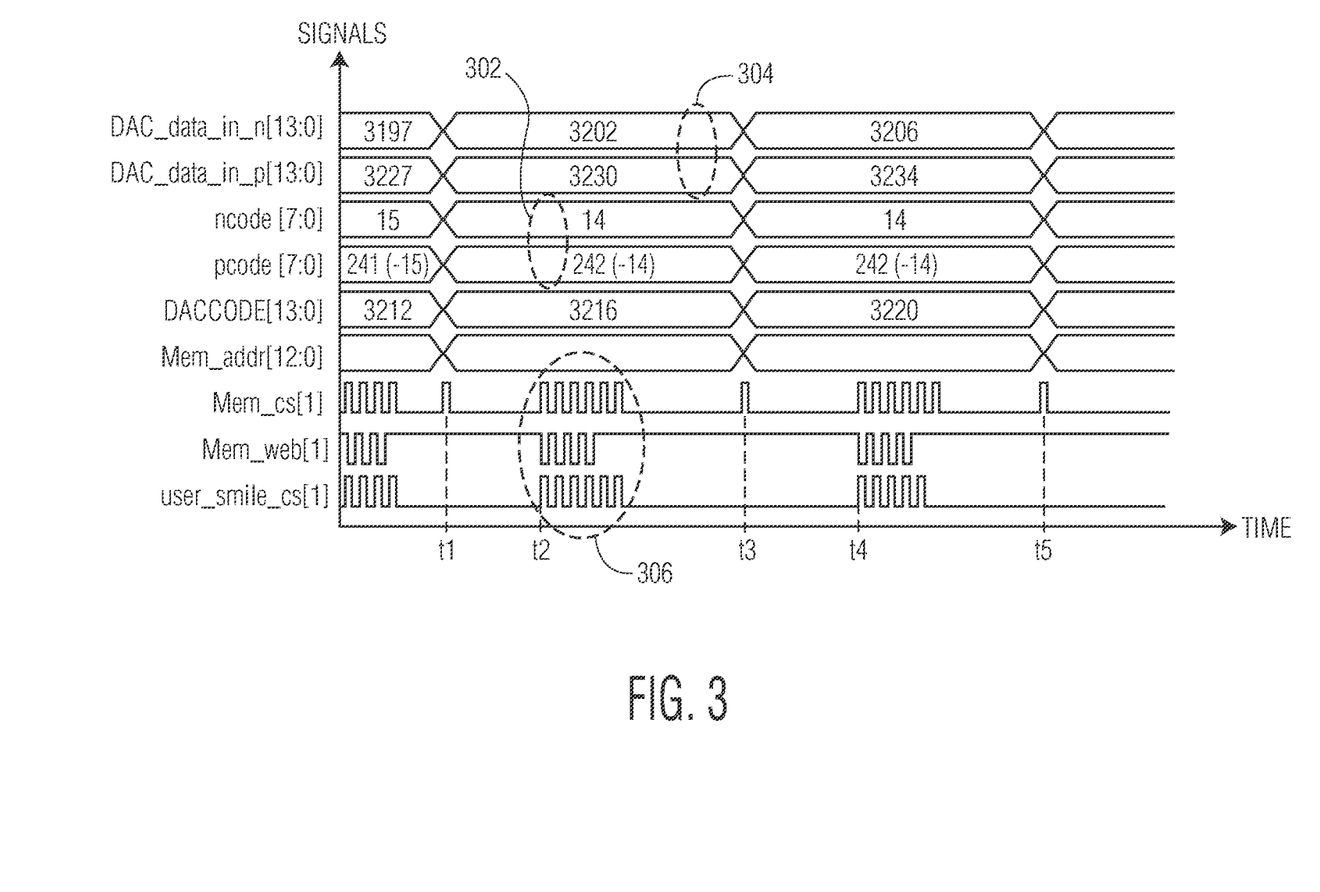
FIG. 3 illustrates a timing diagram of various signals within the IC of FIG. 1, in accordance with one embodiment of the present invention.

FIG. 3 illustrates example waveforms for signals within IC 100 when performing SARADC testing, in accordance with one embodiment of the present invention, in which DAC 112 is a differential 14-bit DAC with differential inputs (an n-side input and a p-side input). Note that DAC 112 can be implemented as any differential DAC as known in the art. DAC_data_in_n[13:0] corresponds to the n-side differential input of DAC 112 for DAC input code DACCODE[13:0], and DAC_data_in_p[13:0] corresponds to the p-side differential input of DAC 112 for the DAC input code DACCODE[13:0]. Ncode[7:0] corresponds to the 8-bit ncode correction value corresponding to DACCODE[13:0] and pcode[7:0] corresponds to the 8-bit pcode correction value corresponding to DACCODE[13:0]. That is, pair 302 corresponds to the ncode/pcode value pair for DACCODE[13:0], stored in predetermined byte locations (byte 0 and byte 3) of the memory line of RAM 108 addressed by DACCODE[13:1]. Mem_addr[12:0] corresponds to the 13-bit addresses used to address memory lines of RAM 108. Mem_cs[1] is a one-bit chip select signal which, when asserted to a logic level high, selects RAM 108 (for reads and writes). Mem_web[1] is a one-bit negative-logic write enable signal which, when asserted to a logic level low indicates a write to RAM 108. User_smile_cs[1] is a one-bit chip select value which, when asserted to a logic level high indicates a read or write in RAM 108 corresponding to executing the USER-SMILE algorithm used for SARDAC testing. The example values in FIG. 3 are provided in decimal format, and the values for ncode and pcode are provided in 2's complement format in which the corresponding negative value, if applicable, is provided in parentheses.

At time t1 of FIG. 3, memory engine 104 receives a 12-bit input code (e.g. from SARADC test circuit 116) for the SARADC testing (in which SARADC testing is enabled, and the test select indicates SARADC testing). Memory engine provides DACCODE[13:0] as 3216 (=0xC90=received 12-bit input code and DACCODE[0]=0). Memory engine 104 uses DACCODE[13:1] as the 13-bit memory address (mem_addr[12:0]) to obtain, via memory controller 106, the appropriate line of data which has the required ncode/pcode value pair for the DAC input code of 3216 (in which mem_cs[1] is asserted for this read). Since DAC 112 is implementing 12-bit resolution for the SARADC testing, the required ncode/pcode value pair corresponds to the predetermined byte locations (e.g. byte 0 and byte 3, corresponding to DACCODE[0]=0), which are therefore selected by memory engine 104 from the received read data of the addressed memory line. In the illustrated example, signals 302 correspond to the ncode/pcode value pair obtained from the requested memory line, in which the ncode value is 14, and the pcode value is 242 (which is −14 in 2s complement format). SARADC test circuit 116 can subtract the ncode value from the input DAC code to obtain the 14-bit DAC_data_in_n (in which 3216−14=3202) and subtract the pcode value from the input DAC code to obtain the 14-bit DAC_data_in_p (in which −3216−(−14)=3230). Therefore, differential input signals 304 with values of 3202 and 3230 are provided as inputs to DAC 112.

The example of FIG. 3 corresponds to SARADC testing, therefore, SARADC test circuit 116 generates intermediate data during the testing, as represented, e.g., by signals 306. This intermediate data is used, for example, to implement the USER-SMILE algorithm, and therefore user_smile_cs [1] is asserted for reads and writes performed for the algorithm. These reads and writes, starting at time t2, are performed with RAM 108 (as illustrated with the toggling of mem_cs[1] corresponding to read/write accesses to RAM 108 and the toggling of mem_web[1], as needed). As described above, though, memory engine 104 ensures that these intermediate accesses are performed using those addresses of RAM 108 which store data that can safely be overwritten. In the illustrated example, these reads and writes are performed using those addresses in which DAC-CODE[13:1] is odd (i.e. in which DACCODE[1]=1). These intermediate reads and writes are performed starting at time t2, but are completed prior to time t3, at which point the next input code is provided as DACCODE[13:0] (corresponding to 3220 in the example of FIG. 3). After the next ncode/pcode value pair is obtained for the next DACCODE[13:0]= 3220 at time t3, reads and writes of the intermediate test data are performed starting at time t4, finishing before time t5.

As seen in the example of FIG. 3, memory engine 104 performs memory accesses mutually exclusive in time (such as the accesses for obtaining the calibration codes at times t1 and t3 as compared to the accesses for reading and writing the intermediate data at each of times t2 and t4) and mutually exclusive in addresses (such as needing to read from even address lines at times t1 and t3, but reading/writing from odd address lines at times t2 and t4). Memory engine 104 maintains this exclusivity, even though all reads and writes are performed in the same on-chip memory (e.g. RAM 108).

Note that in the illustrated example of FIG. 3, the correction values of ncode and pcode over time have values which are seemingly related to a particular sequential series. However, they are only example values and do not necessarily have any relation to previous and subsequent values. Also, the toggling of signals mem_cs, mem_web, and user_smile is merely representative of example activity and do not accurately depict actual reads and writes which would be occurring in RAM 108. They are meant to illustrate when this type of activity for intermediate test data could occur during ADC testing.

In alternate embodiments, the on-chip memory may store more than two ncode/pcode value pairs in an address line, each corresponding to a different DAC input code, in which the address lines are addressed by an upper portion of significant bits of the DAC input code. In this case, multiple least significant bits may be used to select the appropriate ncode/pcode value pair from the full address line obtained in response to a read access. For example, four pairs may be stored per address line, in which two LSBs can be used to address each of the four pairs.

Figure 4:
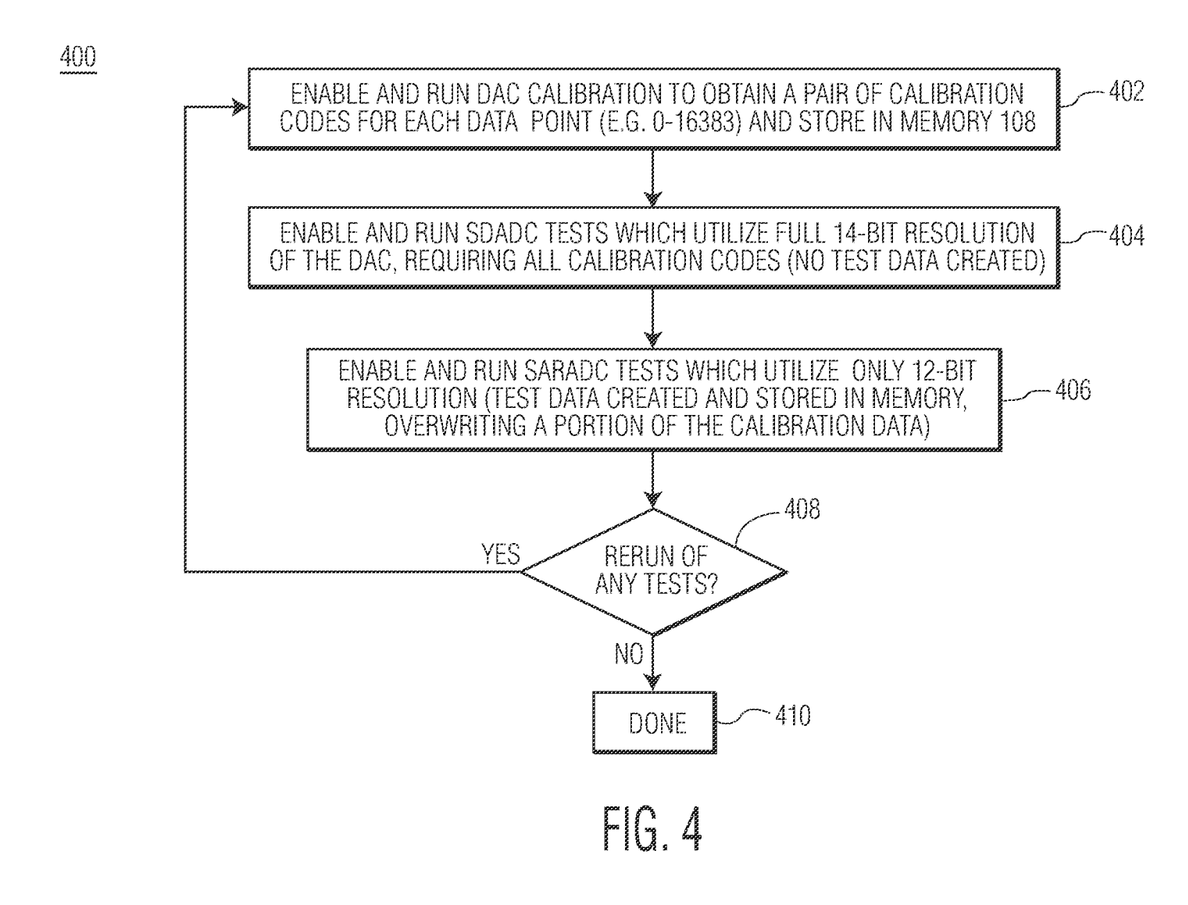
FIG. 4 illustrates, in flow diagram form, a method of performing on-chip testing of the ADCs, in accordance with one embodiment of the present invention.

FIG. 4 illustrates a method 400 of performing ADC testing of both SDADCs and SARADCs using 32 KB RAM 108 and a differential 14-bit DAC, in accordance with one embodiment of the present invention. In the illustrated embodiment, only RAM 108 is used for storing calibration codes and for performing the ADC testing, and therefore, the available memory for the ADC testing is constrained to just the 32 KB of RAM 108. Method 400 begins in block 402 in which DAC calibration is enabled and run to obtain a pair of calibration codes (ncode/pcode values) for each data point (e.g. 0-16383) and store those pairs of calibration codes in memory 108. As described above, memory engine 104 can control the storage of the calibration codes to be arranged in the format illustrated in FIG. 2. Alternatively, other data arrangements can be used when storing the calibration codes.

Since SDADC testing requires the full 14-bit resolution of the differential DAC, in which all the pairs of calibration codes for each of the $2^{14}$ data points stored in RAM 108 need to be available, testing continues in block 404 by enabling and running SDADC tests. For SDADC tests, all calibration codes are required but no test data is created. Therefore, memory engine 104 can access all of the calibration codes of RAM 108 and none of the calibration codes needs to be overwritten. Note that for SDADC testing, any number of SDADCs within ADCs under tests 114 can be tested in block 404.

After SDADC testing, testing continues in block 404 by enabling and running SARADC tests. These test utilize only 12-bit resolution of the differential DAC. Therefore, a portion of RAM 108 can be safely overwritten since only $2^{12}$ of the calibration data is needed. For the SARADC testing, test data is created and stored in memory, overwriting a portion of the calibration data. As described above, if the calibration data is stored according to the arrangement of FIG. 2, then those address locations of RAM 108 addressed by odd values of DACCODE[13:1] can be safely overwritten, in that the calibration data originally stored at those locations will not be needed for the SARADC testing (unlike for the SDADC testing). Note that for SARADC testing, any number of SARADCs within ADCs under tests 114 can be tested in block 406.

At decision diamond 408, it is determined if any of the tests need to be re-run. If not, testing is complete at 410. However, if any of the SDADC tests need to be re-run, method 400 has to return to block 402 in which the DAC calibration data needs to be obtained again and stored in RAM 108 since the full ncode/pcode value pairs are needed for the SDADC testing. If only the SARADC tests need to be re-run, method 400 could return to 406 since the calibration data for the 12-bit resolution version of DAC 112 is still present in RAM 108.

Any of the ADC testing performed by SDADC test circuit 122, SARADC test circuit 116, calibration circuit 118, memory engine 104, DAC 112, and control circuit 102 can be performed on-chip, as with BIST. The ability to implement the testing as BIST using only on-chip memory (such as RAM 108) also allows for the testing to be performed post-production of IC 100. That is, IC 100 can be programmed to perform the testing as needed during normal operation. This allows for the determination of reduced performance of an ADC at any point after production.

Therefore, by now it can be appreciated that ADC production testing which supports both SDADC and SARADC testing can be implemented on-chip, even with using just a size-constrained on-chip memory. By using a memory engine to ensure the proper arrangement of data storage into the on-chip memory, the same on-chip memory can be used to store all the calibration data required for ADC testing using a full resolution of the testing DAC as well as to store any intermediate data required for ADC testing which requires less than the full resolution of the testing DAC. Furthermore, the size-constrained on-chip memory can be used without needing to rely on any hardware or software data compression techniques.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, memory 110 can use different addressing schemes to store the calibration codes, rather than be implemented as a content addressable memory (CAM). Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a method for on-chip testing of analog-to-digital converters (ADCs) in an integrated circuit, in which the ADCs include a first set of ADCs of a first ADC type and a second set of ADCs of a second ADC type, different from the first ADC type, includes performing calibration of an N-bit differential digital-to-analog converter (DAC) used in performing the on-chip testing of the ADCs and storing a pair of calibration codes for each of $2^N$ possible DAC input codes for the DAC in an on-chip memory; testing the first set of ADCs using the pairs of calibration codes stored in the on-chip memory and a full N-bit resolution of the DAC; and, after the testing the first set of ADCs, testing the second set of ADCs using pairs of calibration codes corresponding to a reduced M-bit resolution of the DAC, wherein M and N are positive integers and M is less than N, wherein during the testing of the second set of ADCs, the method further includes overwriting a portion of the calibration codes stored in the on-chip memory. In one aspect of the above embodiment, after performing the calibration, each addressable memory line of the on-chip memory stores multiple pairs of calibration codes. In a further aspect, for each addressable memory line of the on-chip memory, each of the multiple pairs of calibration codes corresponds to a DAC input code having a same upper portion of significant bits as a memory address of the addressable memory line. In yet a further aspect, for each addressable memory line of the on-chip memory, a pair of the multiple pairs of calibration codes is selectable by at least a least significant bit of the DAC input code corresponding to the pair of the multiple pairs of calibration codes. In another aspect of the above embodiment, the pair of calibration codes for each of the $2^N$ possible DAC input codes for the DAC in the on-chip memory includes a corresponding first calibration code for the DAC input code for use with a first input of the differential DAC during ADC testing and a corresponding second calibration code for the DAC input code for use with a second input of the differential DAC during ADC testing. In a further aspect, the corresponding first calibration code and the corresponding second calibration code for a first N-bit DAC input code of the $2^N$ possible DAC input codes is stored in a first memory line of the on-chip memory addressed by upper significant bits of the first DAC input code, wherein the first memory line is obtainable with a single read access to the on-chip memory. In yet a further aspect, the first memory line of the on-chip memory further stores the corresponding first calibration code and the corresponding second calibration code for a second N-bit DAC input code of the $2^N$ possible DAC input codes, wherein the first and second N-bit DAC input codes differ by only a least significant bit (LSB), wherein the corresponding first and second calibration codes for the first DAC input are indicated by a first value of the LSB, and the corresponding first and second calibration codes for the second DAC input are indicated by a second value of the LSB. In another aspect, the testing the first set of ADCs using the pairs of calibration codes stored in the on-chip memory and the full N-bit resolution of the DAC includes generating a first DAC input code; accessing a first address line of the on-chip memory addressed by N−1 upper significant bits of the first DAC input code, wherein the N−1 upper significant bits is capable of addressing any memory line of the on-chip memory; and providing a selected pair of calibration codes corresponding to the received first DAC input code from the first accessed address line, based on an LSB of the first input code, to calibrate the DAC during testing the first set of ADCs. In a further aspect, the testing the second set of ADCs using pairs of calibration codes corresponding to the reduced M-bit resolution of the DAC includes generating a second DAC input code; accessing a second address line of the on-chip memory addressed by N−1 upper significant bits of the second DAC input code, wherein the N−1 upper significant bits of the second DAC input code is capable of addressing only a first portion of memory locations of the on-chip memory; and providing a selected pair of calibration codes corresponding to the received second DAC input code from predetermined byte locations of the second accessed line to calibrate the DAC during testing the second set of ADCs. In yet a further aspect, the testing the second set of ADCs using pairs of calibration codes corresponding to the reduced M-bit resolution of the DAC further includes performing reads, writes, or both reads and write in a second portion of memory locations of the on-chip memory, mutually exclusive with the first portion, in which the first portion of memory locations and the second portion of memory locations together provide all memory locations of the on-chip memory, wherein performing writes in the second portion of memory locations overwrites calibration codes stored in an addressed memory line of the second portion of memory locations. In yet a further aspect, after performing testing of the first set of ADCs and the second set of ADCs, repeating the performing the calibration of the N-bit differential DAC to repeat storing the pairs of calibration codes for each of $2^N$ possible DAC input codes in the on-chip memory prior to subsequently re-testing the first set of ADCs. In another aspect of the above embodiment, the first set of ADCs includes one or more sigma-delta ADCs (SDADCs), and the second set of ADCs includes one or more successive approximation register ADCs (SARADCs).

In another embodiment, an integrated circuit includes built-in self-test (BIST) circuitry which performs on-chip testing of analog-to-digital converters (ADCs). The ADCs include a first set of ADCs of a first ADC type and a second set of ADCs of a second ADC type, different from the first ADC type, and the integrated circuit includes on-chip memory; an N-bit differential digital-to-analog converter (DAC) used in performing the on-chip testing of the ADCs; calibration circuitry coupled to the N-bit differential DAC and configured to generate a pair of calibration codes corresponding to each possible N-bit DAC input code for the N-bit differential DAC; and a memory engine coupled to the calibration circuitry and the on-chip memory. The memory engine is configured to store each pair of calibration codes in a memory line of the on-chip memory addressed by upper significant bits of a corresponding N-bit DAC input code, wherein, after generating all pairs of calibration codes, each memory line includes multiple pairs of calibration codes; and obtain a first pair of calibration codes from the on-chip memory for a received DAC input code by initiating a read to receive read data from an address line in the on-chip memory addressed by N−1 upper significant bits of the received DAC input code and using a least significant bit (LSB) of the received DAC input code to select the first pair of calibration codes from the received read data. In one aspect, the integrated circuit further includes an ADC under test coupled to receive an output of the N-bit differential DAC, wherein the memory engine is configured to provide a corresponding pair of calibration codes from the on-chip memory, including a first calibration code for use with an n-input of the N-bit differential DAC during ADC testing and a second calibration code for use with a p-input of the N-bit differential DAC during ADC testing. In a further aspect, the ADC under test is characterized as SARADC, which requires M-bit resolution from the N-bit differential DAC during ADC testing, and the memory engine is further configured to, during ADC testing, access a first address line from the on-chip memory addressed by N−1 upper significant bits of a test DAC input code for the testing of the SARADC, wherein the N−1 upper significant bits of the first test DAC input code is capable of addressing only a first portion of memory locations of the on-chip memory; and provide a selected pair of calibration codes corresponding to the test DAC input code from one or more predetermined byte locations of the accessed first address line to calibrate the N-bit differential DAC. In yet a further aspect, the memory engine is further configured to direct reads, writes, or both reads and write to a second portion of memory locations of the on-chip memory, mutually exclusive with the first portion, in which the first portion of memory locations and the second portion of memory locations together provide all memory locations of the on-chip memory, wherein the writes to the second portion of memory locations on the on-chip memory overwrites calibration codes stored in an addressed memory line of the second portion of memory locations. In yet an even further aspect, the ADC under test is characterized as an SDADC, which requires N-bit resolution from the N-bit differential DAC during ADC testing, and the memory engine is further configured to, during ADC testing, access a first address line from the on-chip memory addressed by N−1 upper significant bits of a test DAC input code for the testing of the SDADC, wherein the N−1 upper significant bits is capable of addressing any memory line of the on-chip memory; and provide a selected pair of calibration codes corresponding to the test DAC input code from the accessed first address line, based on an LSB of the test DAC input code, to calibrate the N-bit differential DAC. In another aspect of the another embodiment, the integrated circuit further includes control circuitry configured to direct the memory engine and calibration circuitry to generate and store the pairs of calibration codes for each possible N-bit DAC input code for the N-bit differential DAC, subsequently direct testing of the first set of ADCs using the pairs of calibration codes stored in the on-chip memory and a full N-bit resolution of the DAC, and subsequently to the testing of the first set of ADCs, direct testing of the second set of ADCs using pairs of calibration codes corresponding to a reduced M-bit resolution of the DAC, wherein M and N are positive integers and M is less than N, wherein during the testing of the second set of ADCs, memory engine is configured to overwrite a portion of the calibration codes stored in the on-chip memory. In one aspect, the first set of ADCs includes one or more SDADCs, and the second set of ADCs includes one or more SAR-DACs.

In another embodiment, an integrated circuit includes built-in self-test (BIST) circuitry which performs on-chip testing of analog-to-digital converters (ADCs). The ADCs include a set of sigma delta ADCs (SDADCs) and a set of successive approximation register ADCs (SARADCs), and the integrated circuit includes on-chip memory; an N-bit differential digital-to-analog converter (DAC) used in performing the on-chip testing of the ADCs; calibration circuitry coupled to the N-bit differential DAC and configured to generate a pair of calibration codes corresponding to each possible N-bit DAC input code for the N-bit differential DAC; a memory engine, coupled to the calibration circuitry and the on-chip memory; and control circuitry configured to direct the memory engine and calibration circuitry to generate and store the pairs of calibration codes for each possible N-bit DAC input code for the N-bit differential DAC, wherein the memory engine is configured to store each pair of calibration codes in a memory line of the on-chip memory addressed by upper significant bits of a corresponding N-bit DAC input code, wherein, after generating and storing all pairs of calibration codes, each memory line includes multiple pairs of calibration codes, direct testing of the set of SDADCs using the pairs of calibration codes stored in the on-chip memory and a full N-bit resolution of the DAC, and subsequently to the testing of the set of SDADCs, direct testing of the set of SARADCs using pairs of calibration codes corresponding to a reduced M-bit resolution of the DAC, wherein M and N are positive integers and M is less than N, wherein during the testing of the set of SARADCs, memory engine is configured to overwrite a portion of the calibration codes stored in the on-chip memory.

What is claimed is:

1. A method for on-chip testing of analog-to-digital converters (ADCs) in an integrated circuit, the ADCs including a first set of ADCs of a first ADC type and a second set of ADCs of a second ADC type, different from the first ADC type, the method comprising:
performing calibration of an N-bit differential digital-to-analog converter (DAC) used in performing the on-chip testing of the ADCs and storing a pair of calibration codes for each of $2^N$ possible DAC input codes for the DAC in an on-chip memory;
testing the first set of ADCs using the pairs of calibration codes stored in the on-chip memory and a full N-bit resolution of the DAC; and
after the testing the first set of ADCs, testing the second set of ADCs using pairs of calibration codes corresponding to a reduced M-bit resolution of the DAC, wherein M and N are positive integers and M is less than N, wherein during the testing of the second set of ADCs, the method further comprises overwriting a portion of the calibration codes stored in the on-chip memory.

2. The method of claim 1, wherein, after performing the calibration, each addressable memory line of the on-chip memory stores multiple pairs of calibration codes.

3. The method of claim 2, wherein, for each addressable memory line of the on-chip memory:
each of the multiple pairs of calibration codes corresponds to a DAC input code having a same upper portion of significant bits as a memory address of the addressable memory line.

4. The method of claim 3, wherein, for each addressable memory line of the on-chip memory:
a pair of the multiple pairs of calibration codes is selectable by at least a least significant bit of the DAC input code corresponding to the pair of the multiple pairs of calibration codes.

5. The method of claim 1, wherein the pair of calibration codes for each of the $2^N$ possible DAC input codes for the DAC in the on-chip memory includes a corresponding first calibration code for the DAC input code for use with a first input of the differential DAC during ADC testing and a corresponding second calibration code for the DAC input code for use with a second input of the differential DAC during ADC testing.

6. The method of claim 5, wherein the corresponding first calibration code and the corresponding second calibration code for a first N-bit DAC input code of the $2^N$ possible DAC input codes is stored in a first memory line of the on-chip memory addressed by upper significant bits of the first DAC input code, wherein the first memory line is obtainable with a single read access to the on-chip memory.

7. The method of claim 6, wherein the first memory line of the on-chip memory further stores the corresponding first calibration code and the corresponding second calibration code for a second N-bit DAC input code of the $2^N$ possible DAC input codes, wherein the first and second N-bit DAC input codes differ by only a least significant bit (LSB), wherein:
the corresponding first and second calibration codes for the first DAC input are indicated by a first value of the LSB, and
the corresponding first and second calibration codes for the second DAC input are indicated by a second value of the LSB.

8. The method of claim 1, wherein the testing the first set of ADCs using the pairs of calibration codes stored in the on-chip memory and the full N-bit resolution of the DAC comprises:
generating a first DAC input code;
accessing a first address line of the on-chip memory addressed by N−1 upper significant bits of the first DAC input code, wherein the N−1 upper significant bits is capable of addressing any memory line of the on-chip memory;
providing a selected pair of calibration codes corresponding to the received first DAC input code from the first accessed address line, based on an LSB of the first input code, to calibrate the DAC during testing the first set of ADCs.

9. The method of claim 8, wherein the testing the second set of ADCs using pairs of calibration codes corresponding to the reduced M-bit resolution of the DAC comprises:
generating a second DAC input code;
accessing a second address line of the on-chip memory addressed by N−1 upper significant bits of the second DAC input code, wherein the N−1 upper significant bits of the second DAC input code is capable of addressing only a first portion of memory locations of the on-chip memory; and providing a selected pair of calibration codes corresponding to the received second DAC input code from predetermined byte locations of the second accessed line to calibrate the DAC during testing the second set of ADCs.

10. The method of claim 9, wherein the testing the second set of ADCs using pairs of calibration codes corresponding to the reduced M-bit resolution of the DAC further comprises:

performing reads, writes, or both reads and write in a second portion of memory locations of the on-chip memory, mutually exclusive with the first portion, in which the first portion of memory locations and the second portion of memory locations together provide all memory locations of the on-chip memory, wherein performing writes in the second portion of memory locations overwrites calibration codes stored in an addressed memory line of the second portion of memory locations.

11. The method of claim 10, wherein after performing testing of the first set of ADCs and the second set of ADCs, repeating the performing the calibration of the N-bit differential DAC to repeat storing the pairs of calibration codes for each of $2^N$ possible DAC input codes in the on-chip memory prior to subsequently re-testing the first set of ADCs.

12. The method of claim 1, wherein the first set of ADCs comprises one or more sigma-delta ADCs (SDADCs), and the second set of ADCs comprises one or more successive approximation register ADCs (SARADCs).

13. An integrated circuit including built-in self-test (BIST) circuitry which performs on-chip testing of analog-to-digital converters (ADCs), the ADCs including a first set of ADCs of a first ADC type and a second set of ADCs of a second ADC type, different from the first ADC type, the integrated circuit comprising:

on-chip memory;

an N-bit differential digital-to-analog converter (DAC) used in performing the on-chip testing of the ADCs;

calibration circuitry coupled to the N-bit differential DAC and configured to generate a pair of calibration codes corresponding to each possible N-bit DAC input code for the N-bit differential DAC;

a memory engine, coupled to the calibration circuitry and the on-chip memory, and configured to:

store each pair of calibration codes in a memory line of the on-chip memory addressed by upper significant bits of a corresponding N-bit DAC input code, wherein, after generating all pairs of calibration codes, each memory line includes multiple pairs of calibration codes; and obtain a first pair of calibration codes from the on-chip memory for a received DAC input code by initiating a read to receive read data from an address line in the on-chip memory addressed by N−1 upper significant bits of the received DAC input code and using a least significant bit (LSB) of the received DAC input code to select the first pair of calibration codes from the received read data.

14. The integrated circuit of claim 13, further comprising:

an ADC under test coupled to receive an output of the N-bit differential DAC, wherein the memory engine is configured to provide a corresponding pair of calibration codes from the on-chip memory, including a first calibration code for use with an n-input of the N-bit differential DAC during ADC testing and a second calibration code for use with a p-input of the N-bit differential DAC during ADC testing.

15. The integrated circuit of claim 14, wherein the ADC under test is characterized as SARADC, which requires M-bit resolution from the N-bit differential DAC during ADC testing, the memory engine is further configured to, during ADC testing:

access a first address line from the on-chip memory addressed by N−1 upper significant bits of a test DAC input code for the testing of the SARADC, wherein the N−1 upper significant bits of the first test DAC input code is capable of addressing only a first portion of memory locations of the on-chip memory; and provide a selected pair of calibration codes corresponding to the test DAC input code from one or more predetermined byte locations of the accessed first address line to calibrate the N-bit differential DAC.

16. The integrated circuit of claim 15, wherein the memory engine is further configured to:

direct reads, writes, or both reads and write to a second portion of memory locations of the on-chip memory, mutually exclusive with the first portion, in which the first portion of memory locations and the second portion of memory locations together provide all memory locations of the on-chip memory, wherein the writes to the second portion of memory locations on the on-chip memory overwrites calibration codes stored in an addressed memory line of the second portion of memory locations.

17. The integrated circuit of claim 16, wherein the ADC under test is characterized as an SDADC, which requires N-bit resolution from the N-bit differential DAC during ADC testing, the memory engine is further configured to, during ADC testing:

access a first address line from the on-chip memory addressed by N−1 upper significant bits of a test DAC input code for the testing of the SDADC, wherein the N−1 upper significant bits is capable of addressing any memory line of the on-chip memory; and provide a selected pair of calibration codes corresponding to the test DAC input code from the accessed first address line, based on an LSB of the test DAC input code, to calibrate the N-bit differential DAC.

18. The integrated circuit of claim 13, further comprising control circuitry configured to:

direct the memory engine and calibration circuitry to generate and store the pairs of calibration codes for each possible N-bit DAC input code for the N-bit differential DAC, subsequently direct testing of the first set of ADCs using the pairs of calibration codes stored in the on-chip memory and a full N-bit resolution of the DAC, and subsequently to the testing of the first set of ADCs, direct testing of the second set of ADCs using pairs of calibration codes corresponding to a reduced M-bit resolution of the DAC, wherein M and N are positive integers and M is less than N, wherein during the testing of the second set of ADCs, memory engine is configured to overwrite a portion of the calibration codes stored in the on-chip memory.

19. The integrated circuit of claim 18, wherein the first set of ADCs comprises one or more SDADCs, and the second set of ADCs comprises one or more SARDACs.

20. An integrated circuit including built-in self-test (BIST) circuitry which performs on-chip testing of analogto-digital converters (ADCs), the ADCs including a set of sigma delta ADCs (SDADCs) and a set of successive approximation register ADCs (SARADCs), the integrated circuit comprising:

on-chip memory;

an N-bit differential digital-to-analog converter (DAC) used in performing the on-chip testing of the ADCs;

calibration circuitry coupled to the N-bit differential DAC and configured to generate a pair of calibration codes corresponding to each possible N-bit DAC input code for the N-bit differential DAC;

a memory engine, coupled to the calibration circuitry and the on-chip memory;

control circuitry configured to:

direct the memory engine and calibration circuitry to generate and store the pairs of calibration codes for each possible N-bit DAC input code for the N-bit differential DAC, wherein the memory engine is configured to store each pair of calibration codes in a memory line of the on-chip memory addressed by upper significant bits of a corresponding N-bit DAC input code, wherein, after generating and storing all pairs of calibration codes, each memory line includes multiple pairs of calibration codes,         direct testing of the set of SDADCs using the pairs of calibration codes stored in the on-chip memory and a full N-bit resolution of the DAC, and         subsequently to the testing of the set of SDADCs, direct testing of the set of SARADCs using pairs of calibration codes corresponding to a reduced M-bit resolution of the DAC, wherein M and N are positive integers and M is less than N, wherein during the testing of the set of SARADCs, memory engine is configured to overwrite a portion of the calibration codes stored in the on-chip memory.

* * * * *